(12) United States Patent
Liu et al.

(10) Patent No.: US 8,035,447 B2
(45) Date of Patent: Oct. 11, 2011

(54) ACTIVE CIRCUITS WITH LOAD LINEARIZATION

(75) Inventors: Li Liu, San Diego, CA (US); Prasad S. Gudem, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 140 days.

(21) Appl. No.: 11/842,712

(22) Filed: Aug. 21, 2007

(65) Prior Publication Data
US 2009/0051424 A1 Feb. 26, 2009

(51) Int. Cl.
H03F 1/26 (2006.01)
(52) U.S. Cl. .......................................... 330/149; 330/254
(58) Field of Classification Search .................. 330/149, 330/254, 311, 250; 455/341; 375/296–297
See application file for complete search history.

(56) References Cited

U.S. PATENT DOCUMENTS

| | | | | |
|---|---|---|---|---|
| 4,568,885 A | * | 2/1986 | McKenzie et al. | 330/253 |
| 5,606,286 A | * | 2/1997 | Bains | 330/149 |
| 5,715,532 A | | 2/1998 | Sagawa et al. | |
| 7,078,968 B2 | * | 7/2006 | Gaeta et al. | 330/254 |
| 7,259,569 B2 | * | 8/2007 | Kim | 324/601 |
| 7,282,994 B2 | * | 10/2007 | Gopinathan et al. | 330/253 |
| 7,312,660 B2 | * | 12/2007 | Koh et al. | 330/260 |
| 7,375,585 B2 | * | 5/2008 | Trifonov et al. | 330/258 |
| 7,400,198 B2 | * | 7/2008 | Kim et al. | 330/295 |
| 2005/0176399 A1 | * | 8/2005 | Aparin | 455/341 |
| 2007/0030076 A1 | * | 2/2007 | Kim et al. | 330/311 |
| 2007/0229154 A1 | * | 10/2007 | Kim et al. | 330/149 |
| 2008/0231362 A1 | * | 9/2008 | Muthali et al. | 330/253 |

FOREIGN PATENT DOCUMENTS

| | | |
|---|---|---|
| EP | 1633041 A2 | 3/2006 |
| JP | 08097644 | 4/1996 |
| WO | WO2007016552 | 2/2007 |

OTHER PUBLICATIONS

International Search Report—PCT/US08/073812, International Search Authority—European Patent Office—Jan. 8, 2009.
Takai N et al.: "GAAS mesfet Linearized Transconductor and Active Load with No CMFB" IEICE Transaction Son Fundamentals of Elelectronics, Engineering Sciences Society, Tokyo, JP, vol. E80-A, No. 2, Feb. 1, 1997, pp. 321-326, XP000752164.

(Continued)

Primary Examiner — Hieu Nguyen
(74) Attorney, Agent, or Firm — Kenyon S. Jenckes; William M. Hooks

(57) ABSTRACT

Active circuits with active loads linearized via distortion cancellation are described. In one design, an apparatus includes a first stage and a load stage. For an amplifier, the first stage amplifies an input signal and provides an output signal having a larger signal level. For a mixer, the first stage mixes an input signal with an LO signal and provides an output signal. The load stage provides an active load for the first stage and is linearized by canceling distortion generated by the active load. In one design, the load stage includes a first transistor that provides the active load and generates distortion due to its nonlinearity. The load stage further includes at least one transistor that generates a replica of the distortion from the first transistor. The distortion replica is used to cancel the distortion from the first transistor. The first stage may also be linearized with distortion cancellation.

27 Claims, 7 Drawing Sheets

OTHER PUBLICATIONS

Written Opinion—PCT/US08/073812, International Search Authority—European Patent Office—Jan. 8, 2009.
Japanese Office Action, Application No. 2003-563123, Date of communication Sep. 24, 2010, Japanese language.
Japanese Office Action Translation, Application No. 2003-563123, Date of communication Sep. 24, 2010.
Taiwanese Search Report—092101461—TIPO—Apr. 7, 2010.
Yoshiki et al., "OFDM Based Adaptive Modultion Systems with a Multilevel Transmit Power Control for High Bit Rate Transmission," The Transactions of the Institute of Electronics, Information and Communication Engineers, 2001, vol. J84-B, (Partial translation).

* cited by examiner

Prior Art

ACTIVE CIRCUITS WITH LOAD LINEARIZATION

BACKGROUND

I. Field

The present disclosure relates generally to circuits, and more specifically to active circuits such as amplifiers and mixers.

II. Background

Amplifiers are commonly used in various electronics devices to provide signal amplification. Different types of amplifiers are available for different uses. For example, a wireless device such as a cellular phone may include a transmitter and a receiver for bidirectional communication. The transmitter may utilize a power amplifier (PA), the receiver may utilize a low noise amplifier (LNA), and the transmitter and receiver may utilize variable gain amplifiers (VGAs).

An LNA is commonly used in a receiver to amplify a low-amplitude signal received via a communication channel. The LNA is often the first active circuit encountered by the received signal and hence has a large impact on the performance of the receiver in several key areas. First, the LNA has a large influence on noise performance since the noise of the LNA is injected directly into the received signal and the noise of subsequent stages is effectively reduced by the gain of the LNA. Second, the linearity of the LNA has a large influence on both the design of subsequent stages in the receiver and receiver performance.

The LNA input signal typically includes various undesired signal components that may come from external interfering sources and leakage from a co-located transmitter. Nonlinearity in the LNA causes the undesired signal components to mix and generate cross modulation distortion that may fall within the desired signal bandwidth. The amplitude of the cross modulation distortion is determined by the amount of nonlinearity in the LNA. Cross modulation distortion components that fall within the desired signal bandwidth act as noise that degrades the signal-to-noise ratio (SNR) of the desired signal. The degradation in SNR caused by LNA nonlinearity may degrade the receiver performance and/or impact the design of subsequent stages. For example, more stringent requirements may be placed on the subsequent stages in order to meet the overall SNR specification of the receiver. A more linear LNA may relax the performance requirements of the subsequent stages.

There is therefore a need in the art for amplifiers having good linearity.

SUMMARY

Active circuits such as amplifiers and mixers with good linearity are described herein. These active circuits employ active loads that are linearized with distortion cancellation. An active load is a load formed with one or more active circuit components such as transistors. Distortion cancellation refers to reduction of distortion generated by one circuit by (i) generating a replica of the distortion with another circuit and (ii) subtracting the distortion replica from the original distortion. If the distortion replica is approximately 180° from the original distortion, then the two distortions may be summed, e.g., by combining their currents. The active circuits with load linearization described herein may achieve good linearity and provide other benefits such as reduced size, lower cost, etc.

In one design, an apparatus includes a first stage and a load stage. The first stage receives an input signal and provides an output signal. For an amplifier, the first stage amplifies the input signal and provides the output signal having a larger signal level. For a mixer, the first stage mixes the input signal with a local oscillator (LO) signal at a first frequency and provides the output signal at a second frequency. The load stage is coupled to the first stage and provides an active load for the first stage. The load stage is linearized by canceling distortion (e.g., third-order intermodulation (IM3) distortion) generated by the active load.

In one design, the load stage includes a first transistor that provides the active load for the first stage and generates distortion due to its nonlinearity. The load stage further includes at least one transistor that generates a replica of the distortion from the first transistor. The distortion replica is used to cancel the distortion from the first transistor. The at least one transistor may be coupled to the first transistor in various manners, as described below. The bias and/or size of the at least one transistor may be selected or varied to match the distortion replica to the distortion from the first transistor, which may improve distortion cancellation.

The input stage may also be linearized with distortion cancellation, as described below. Various aspects and features of the disclosure are described in further detail below.

DETAILED DESCRIPTION

The active circuits with load linearization described herein may be used for various electronics devices such as cellular phones, personal digital assistants (PDAs), handheld devices, wireless modems, laptop computers, cordless phones, Bluetooth devices, consumer electronics devices, etc. For clarity, the use of linearized active circuits in a wireless device, which may be a cellular phone or some other device, is described below.

Figure 1:
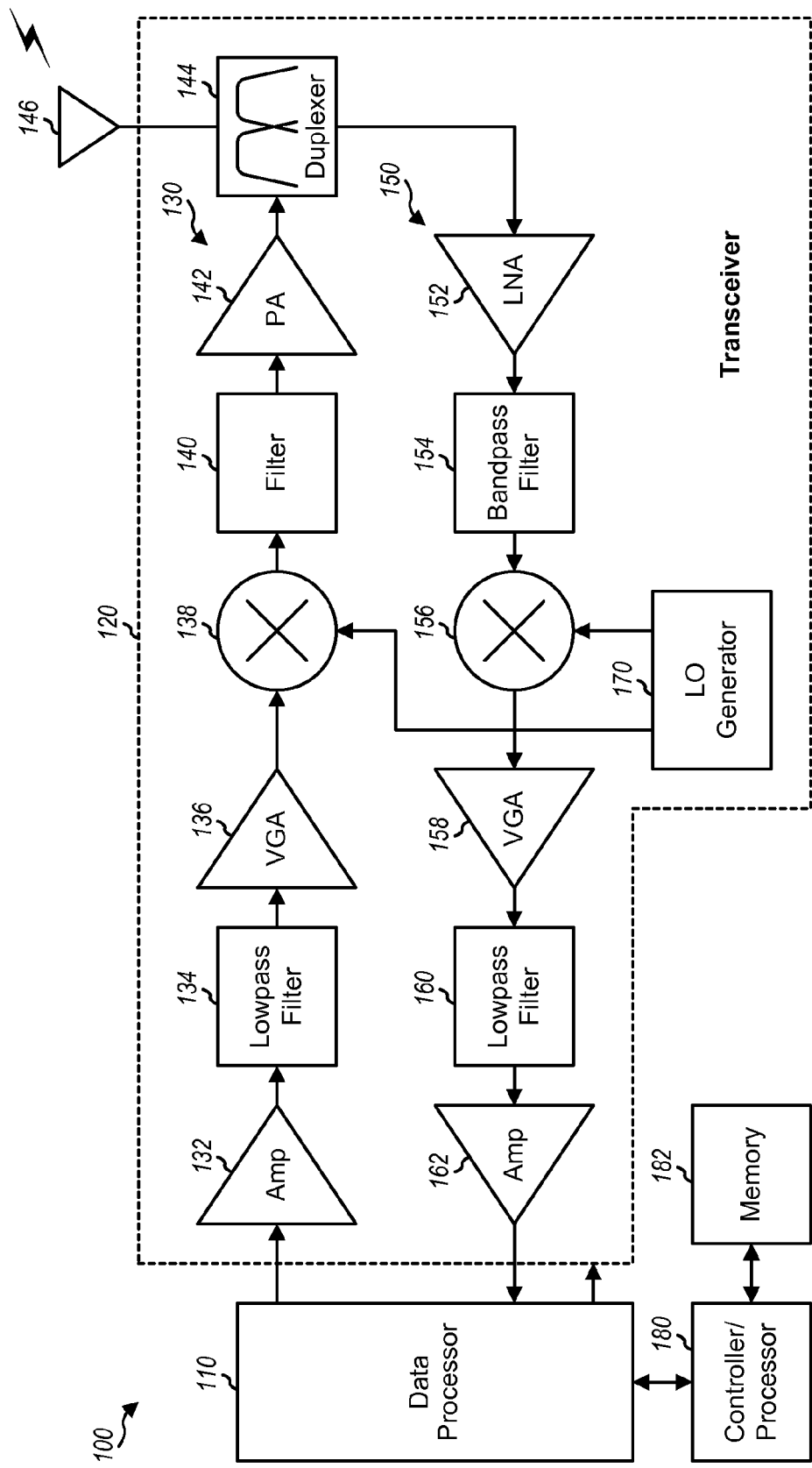
FIG. 1 shows a block diagram of a wireless device.

FIG. 1 shows a block diagram of a design of a wireless device 100. In this design, wireless device 100 includes a data processor 110, a transceiver 120, a controller/processor 180, and a memory 182. Transceiver 120 includes a transmitter 130 and a receiver 150 that support bi-directional wireless communication. In general, wireless device 100 may include any number of transmitters and any number of receivers for any number of communication systems and frequency bands.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

On the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a variable gain amplifier (VGA) 136, and upconverted from baseband to RF by a mixer 138. The upconverted signal is filtered by a bandpass filter 140 to remove images caused by the frequency upconversion, further amplified by a power amplifier (PA) 142, routed through a duplexer 144, and transmitted via an antenna 146.

On the receive path, antenna 146 receives downlink signals from base stations and provides a received signal, which is routed through duplexer 144 and provided to receiver 150. Within receiver 150, the received signal is amplified by a low noise amplifier (LNA) 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input signal, which is provided to data processor 110.

An LO generator 170 generates a transmit LO signal used for frequency upconversion and provides the transmit LO signal to mixer 138. LO generator 170 also generates a receive LO signal used for frequency downconversion and provides the receive LO signal to mixer 156. LO generator 170 may include one or more voltage controlled oscillators (VCOs), phase locked loops (PLLs), reference oscillators, etc.

FIG. 1 shows an example transceiver design. In general, the conditioning of the signals in transmitter 130 and receiver 150 may be performed by one or more stages of amplifier, filter, mixer, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. For example, bandpass filter 154 may be omitted, and the output of LNA 152 may be coupled directly to mixer 156. All or portions of transceiver 120 may be implemented on one or more RF integrated circuits (RFICs), mixed-signal ICs, etc.

Data processor 110 may include various processing units for data transmission and reception and other functions. For example, data processor 110 may include a digital signal processor (DSP), a reduced instruction set computer (RISC) processor, a central processing unit (CPU), etc. Controller/processor 180 may control the operation at wireless device 100. Memory 182 may store program codes and data for wireless device 100. Data processor 110, controller/processor 180, and/or memory 182 may be implemented on one or more application specific integrated circuits (ASICs) and/or other ICs.

As shown in FIG. 1, a transceiver and a receiver may include various active circuits such as amplifiers, mixers, etc. Some active circuits may have high linearity requirements in order to meet system specifications. For example, a receiver in a Code Division Multiple Access (CDMA) system may be required to meet a two-tone test defined in IS-98D. For this test, two tones are located at +900 KHz and +1700 KHz from the center frequency of a desired CDMA signal and are 58 decibels (dB) higher in amplitude than the CDMA signal level. These two tones model strong interfering signals transmitted by a nearby base station in an Advanced Mobile Phone Service (AMPS) system. The receiver is required to meet system requirements in the presence of the two large tones or jammers.

LNA 152 is the first active circuit observed by the received signal with the large jammers. If the two jammers are located at frequencies of f1 and f2, then non-linearity in LNA 152 may cause (i) second-order intermodulation (IM2) distortion components at frequencies such as $f_2-f_1$, $f_2+f_1$, $2f_1$ and $2f_2$ and (ii) third-order intermodulation (IM3) distortion components at frequencies such as $2f_1-f_2$ and $2f_2-f_1$. For the two-tone test, the jammers at $f_1=+900$ KHz and $f_2=+1700$ KHz produce IM3 distortion components at $2f_1-f_2=+100$ KHz and $2f_2-f_1=+2500$ KHz. The IM3 distortion component at +2500 KHz may be filtered by lowpass filter 160 and hence may not degrade performance. However, the IM3 distortion component at +100 KHz falls inside the desired signal bandwidth and acts as additional noise that may degrade performance.

LNA 152 should be linear in order to keep the intermodulation distortion low so that system requirements can be met. High linearity may be achieved for LNA 152 by properly designing the LNA and biasing the LNA with sufficient amount of current.

Figure 2:
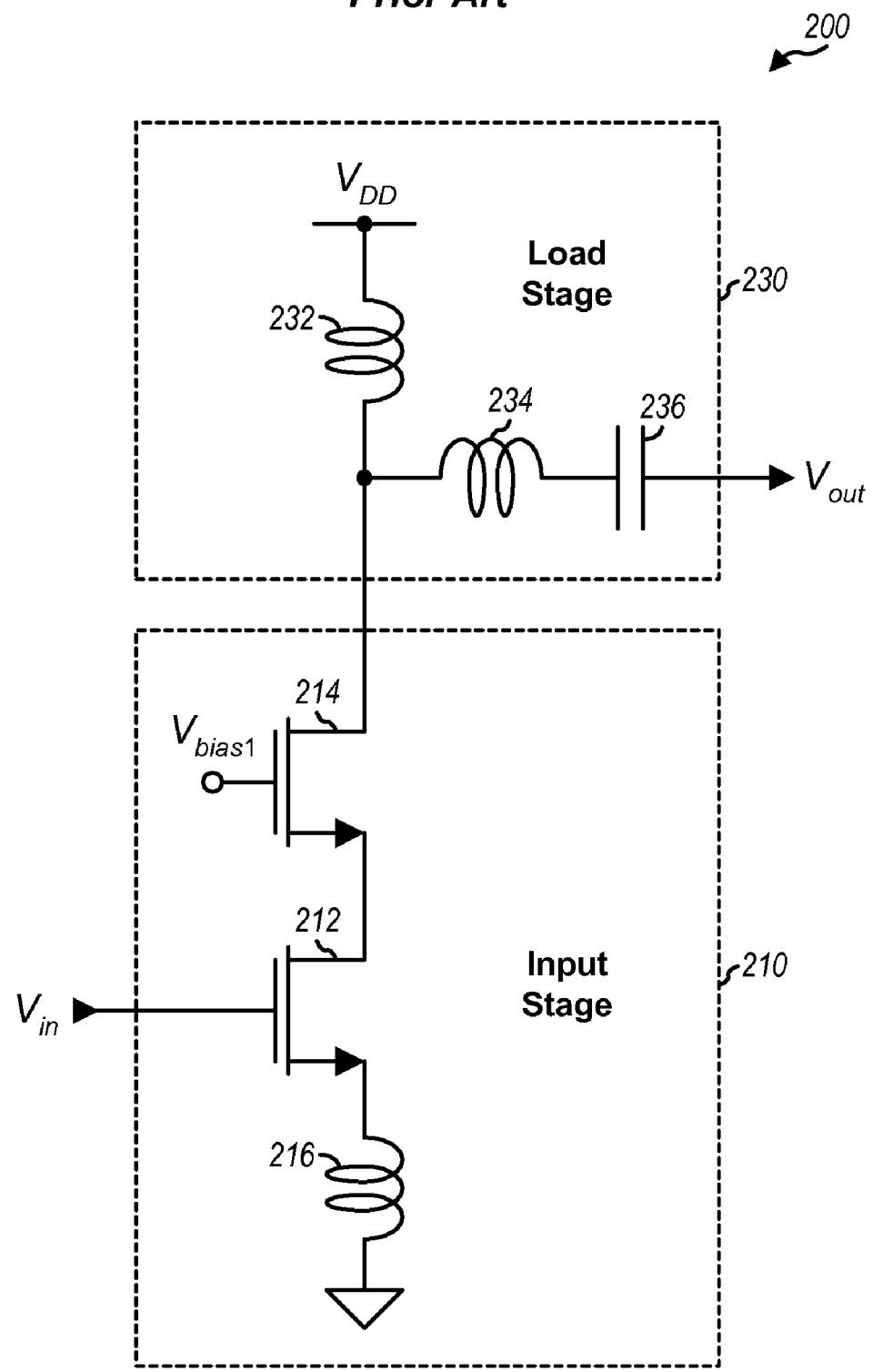
FIG. 2 shows a schematic diagram of an LNA with passive load.

FIG. 2 shows a schematic diagram of an LNA 200 with passive load. LNA 200 may be used for LNA 152 in FIG. 1. LNA 200 includes an input stage 210 that provides signal amplification and a load stage 230 that provides a passive load for input stage 210.

Within input stage 210, an N-channel field effect transistor (N-FET) 212 has its source coupled to one end of an inductor 216, its gate receiving an LNA input signal, $V_{in}$, and its drain coupled to the source of an N-FET 214. The other end of inductor 216 couples to circuit ground. N-FET 214 has its gate receiving a bias voltage, $V_{bias1}$, and its drain coupled to load stage 230. N-FET 212 provides signal amplification for the input signal, $V_{in}$. N-FET 214 provides load isolation for N-FET 212 and drives load stage 230. The bias voltages, bias currents, and sizes of N-FETs 212 and 214 may be selected to achieve the desired gain and linearity for input stage 210. Inductor 216 provides source degeneration for N-FET 212 and may also provide an impedance match looking into the gate of N-FET 212.

Within load stage 230, an inductor 232 has one end coupled to the drain of N-FET 214 and the other end coupled to a power supply voltage, $V_{DD}$. An inductor 234 has one end coupled to the drain of N-FET 214 and the other end coupled to one end of a capacitor 236. The other end of capacitor 236 provides an LNA output signal, $V_{out}$. Inductors 232 and 234 and capacitor 236 form an output impedance matching circuit for LNA 200. The values of inductors 232 and 234 and capacitor 236 may be selected to achieve the desired impedance at a frequency range of interest. Inductors 232 and 234 may be designed to have a sufficiently high quality factor (Q) in order to achieve good gain and noise performance for LNA 200.

LNA 200 may be able to achieve high linearity due to the use of inductors (L) and capacitor (C) for external LC matching. In this case, the load is inherently linear, and only the input stage needs to be linearized in order to achieve high linearity for LNA 200.

Referring back to FIG. 1, LNA 152 may be implemented on an RFIC, and bandpass filter 154 may be a surface acoustic wave (SAW) filter that is external to the RFIC. In this case, the output of LNA 152 may be brought outside of the RFIC, and load stage 230 may be readily implemented with external inductors and capacitor. However, it may be desirable to eliminate the external SAW filter between LNA 152 and mixer 156 in order to reduce cost and improve integration. In this case, the LNA load may be implemented with on-chip inductors that may be fabricated on the RFIC. The on-chip inductors are linear but may occupy a relatively large silicon area within the RFIC. Hence, the on-chip inductors may increase cost, especially for high Q inductors often used for the LNA load. Hence, it may be desirable to avoid the use of on-chip inductors for the LNA load.

Figure 3:
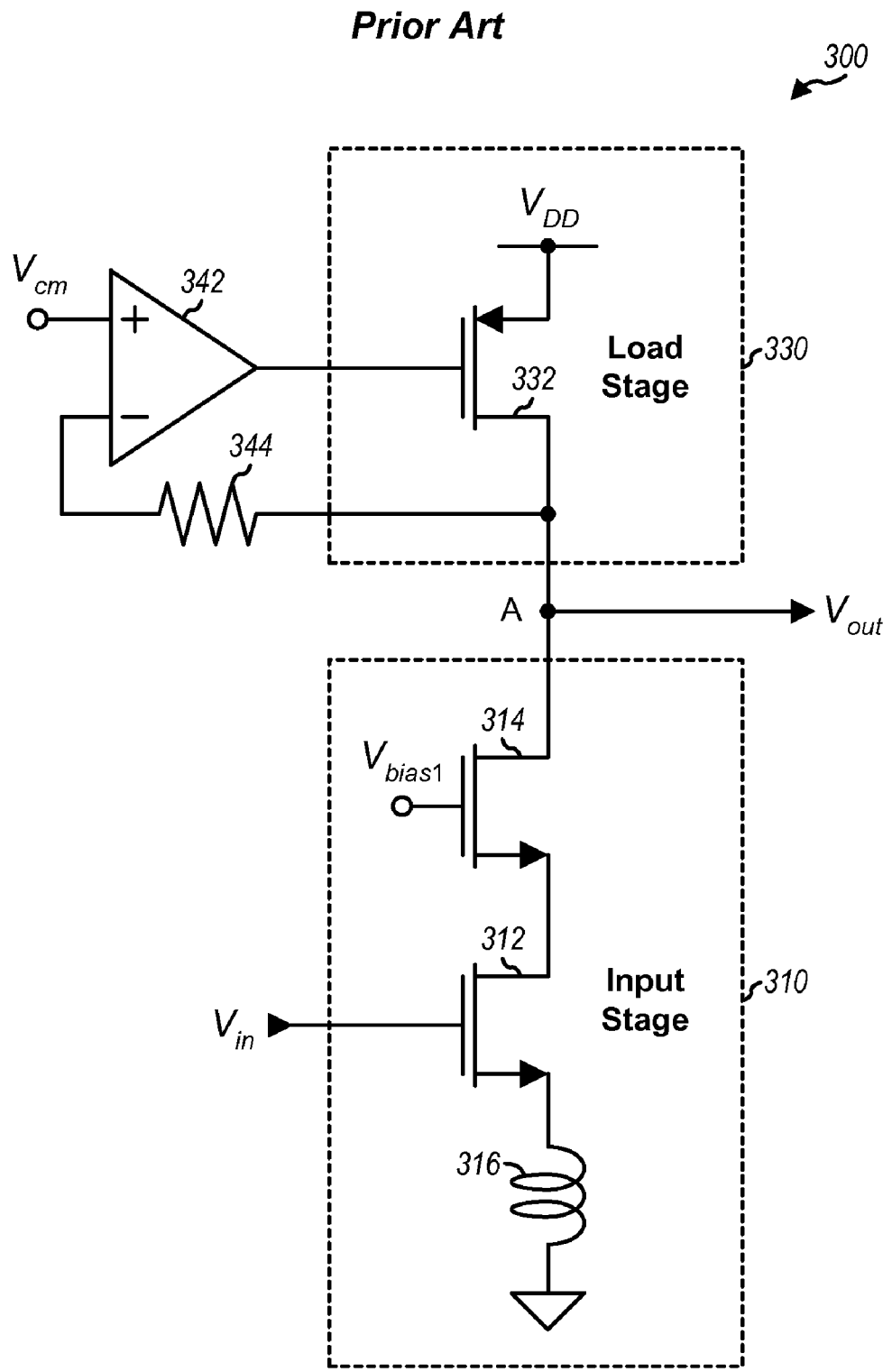
FIG. 3 shows a schematic diagram of an LNA with active load.

FIG. 3 shows a schematic diagram of an LNA 300 with active load, which may also be used for LNA 152 in FIG. 1. LNA 300 includes an input stage 310 that provides signal amplification and a load stage 330 that provides an active load for input stage 310. Input stage 310 includes N-FETs 312 and 314 and an inductor 316 that are coupled in similar manner as N-FETs 212 and 214 and inductor 216, respectively, in FIG. 2. Load stage 330 includes a P-channel FET (P-FET) 332 having its source coupled to the supply voltage, $V_{DD}$, its gate coupled to the output of an operational amplifier (op-amp) 342, and its drain coupled to the drain of N-FET 314 within input stage 310. P-FET 332 provides the active load for input stage 310, and the drain of P-FET 332 provides the LNA output signal, $V_{out}$.

Op-amp 342 and a resistor 344 form a feedback loop that sets the bias of P-FET 332. Resistor 344 has one end coupled to the drain of P-FET 332 and the other end coupled to an inverting input of op-amp 342. Op-amp 342 receives a common mode voltage, $V_{cm}$, which may be a fixed or variable voltage, at a non-inverting input. Op-amp 342 provides a gate voltage for P-FET 332 such that the drain voltage of P-FET 332 is maintained at $V_{cm}$. This ensures that P-FET 332 is biased at a desired operating point. Resistor 344 provides isolation between the LNA output and the op-amp input.

The use of P-FET 332 as the LNA load avoids the need for inductors, which may reduce silicon area for LNA 300 and lower cost. However, LNA 300 may have poor linearity with P-FET 332 as the active load, even if input stage 310 is very linear, since the distortion of P-FET 332 would dominate when input stage 310 is linear. Hence, LNA 300 may not be able to meet the requirements of high performance systems such as CDMA2000 due to the distortion of the P-FET load.

Figure 4:
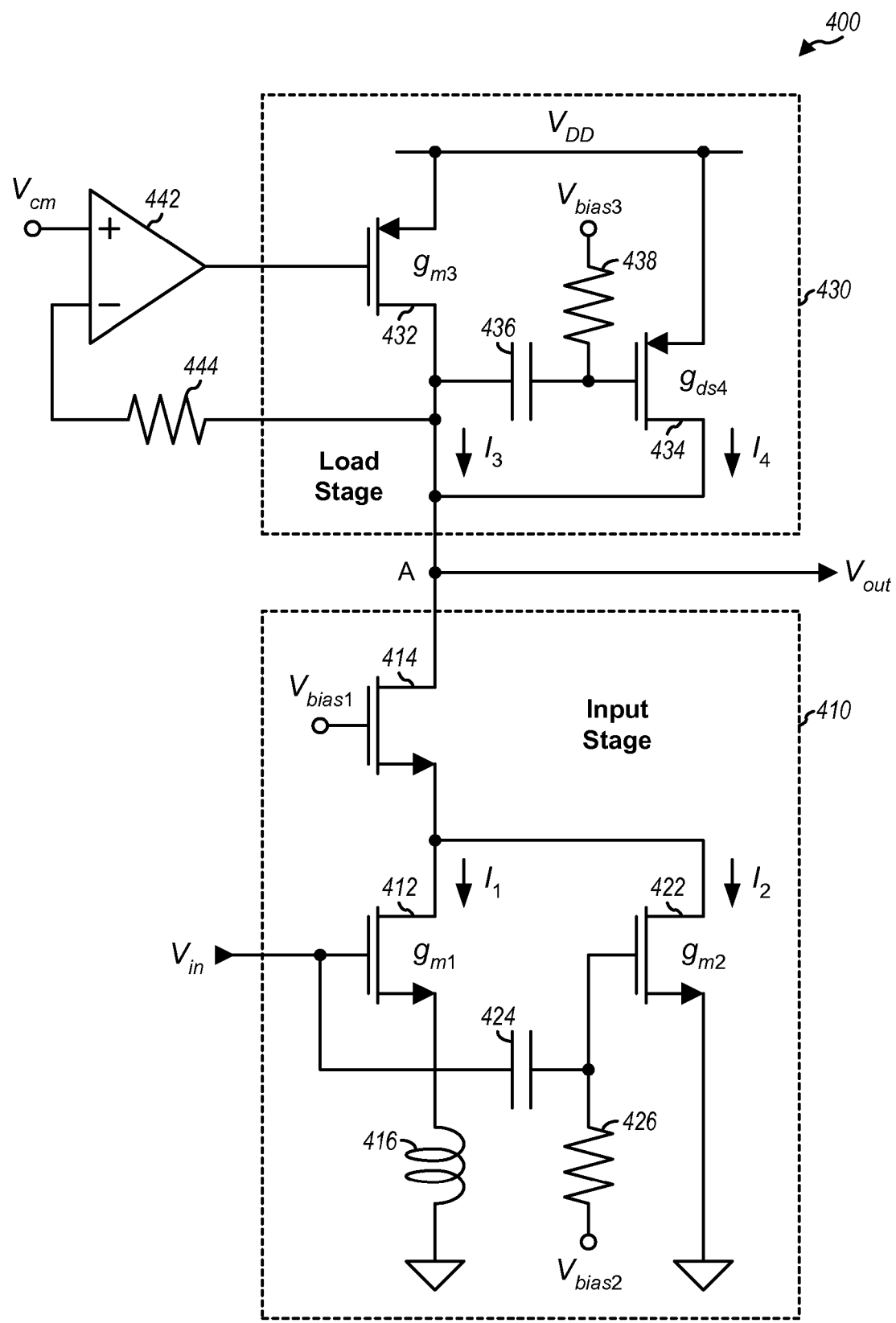
FIG. 4 shows a schematic diagram of an LNA with linearization.

FIG. 4 shows a schematic diagram of a design of an LNA 400 with linearization, which may also be used for LNA 152 in FIG. 1. LNA 400 includes an input stage 410 and a load stage 430. Input stage 410 provides signal amplification and is linearized with distortion cancellation. Load stage 430 provides an active load for input stage 410 and is also linearized with distortion cancellation. LNA 400 may be able to achieve high linearity due to the linearization of both input stage 410 and load stage 430.

Input stage 410 includes N-FETs 412 and 414 and an inductor 416 that are coupled in similar manner as N-FETs 212 and 214 and inductor 216, respectively, in FIG. 2. Input stage 410 further includes an N-FET 422 coupled in parallel with N-FET 412. N-FET 422 has its source coupled to circuit ground, its gate receiving the LNA input signal, $V_{in}$, via an AC coupling capacitor 424, and its drain coupled to the drain of N-FET 412. A resistor 426 has one end coupled to the gate of N-FET 422 and the other end receiving a bias voltage, $V_{bias2}$, which is the gate bias voltage for N-FET 422.

Load stage 430 includes a P-FET 432 that is coupled as described above for P-FET 312 in FIG. 3. P-FET 432 provides an active load for input stage 410, and the drain of P-FET 432 provides the LNA output signal, $V_{out}$. Load stage 430 further includes a P-FET 434 having its source coupled to the supply voltage, $V_{DD}$, its gate coupled to the drain of P-FET 432 via an AC coupling capacitor 436, and its drain coupled to the drain of P-FET 432. A resistor 438 has one end coupled to the gate of P-FET 434 and the other end receiving a bias voltage, $V_{bias3}$, which is the gate bias voltage for P-FET 434. An op-amp 442 and a resistor 444 are coupled in similar manner as op-amp 342 and resistor 344, respectively, in FIG. 3 and form a feedback loop that sets the bias of P-FET 432.

Within input stage 410, N-FET 412 is a main transistor that provides signal amplification, and N-FET 422 is an auxiliary transistor that linearizes the input stage via distortion cancellation. N-FET 412 provides a drain current of $I_1$ and has a transconductance of $g_{m1}$. N-FET 422 provides a drain current of $I_2$ and has a transconductance of $g_{m2}$, where $g_{m2}$ may be much less than $g_{m1}$ in order to avoid canceling of the desired signal component from N-FET 412. N-FETs 412 and 422 may be considered as a composite input stage.

Within load stage 430, P-FET 432 provides a main load for input stage 410, and P-FET 434 provides an auxiliary load and linearizes the overall load via distortion cancellation. P-FET 432 provides a drain current of $I_3$ and has a drain-to-source conductance of $g_{ds3}$. P-FET 434 provides a drain current of $I_4$ and has a transconductance of $g_{m4}$. P-FETs 432 and 434 may be considered as a composite load stage.

The output current, $I_{out}$, of LNA 400 may be expressed as:

$$I_{out} = (I_3 + I_4) - (I_1 + I_2). \qquad \text{Eq (1)}$$

To achieve high linearity for LNA 400, the composite current $(I_1+I_2)$ from input stage 410 should be linear, and the composite current $(I_3+I_4)$ from load stage 430 should also be linear.

As noted above, IM2 distortion components may be filtered whereas IM3 distortion components may fall within the desired signal bandwidth and degrade performance. Hence, LNA 400 may be linearized by canceling IM3 distortion components in both input stage 410 and load stage 430.

The IM3 distortion currents from N-FETs 412 and 422 may be expressed as:

$$I_1''' = V_{in}^3 \cdot g_{m1}'' = V_{in}^3 \cdot \frac{\partial^3 I_1}{\partial V_{in}^3}, \text{ and} \qquad \text{Eq (2)}$$

$$I_2''' = V_{in}^3 \cdot g_{m2}'' = V_{in}^3 \cdot \frac{\partial^3 I_2}{\partial V_{in}^3}, \qquad \text{Eq (3)}$$

where $$\frac{\partial^3 I_x}{\partial V_x^3}$$

denotes a third-order derivative of $I_x$ with respect to $V_x$, $g_{m1}''$ is the transconductance of N-FET 412 for IM3 distortion components, $g_{m2}''$ is the transconductance of N-FET 422 for IM3 distortion components, and $I_1'''$ and $I_2'''$ are IM3 distortion currents from N-FETs 412 and 422, respectively.

For N-FET 412, $$g_{m1} = \frac{\partial I_1}{\partial V_{in}}, \ g_{m1}' = \frac{\partial^2 I_1}{\partial V_{in}^2}, \text{ and } g_{m1}'' = \frac{\partial^3 I_1}{\partial V_{in}^3}.$$

As shown in equations (2) and (3), the IM3 distortion current from each N-FET is equal to the cube of the input signal, $V_{in}$, times the transconductance of the N-FET for IM3 distortion components.

The IM3 distortion currents from P-FETs 432 and 434 may be expressed as:

$$I_3''' = V_{out}^3 \cdot g_{ds3}'' = V_{out}^3 \cdot \frac{\partial^3 I_3}{\partial'' V_{out}^3}, \text{ and} \qquad \text{Eq (4)}$$

$$I_4''' = V_{out}^3 \cdot g_{m4}'' = V_{out}^3 \cdot \frac{\partial^3 I_4}{\partial V_{out}^3}, \qquad \text{Eq (5)}$$

where $g_{ds3}''$ is the drain-to-source conductance of P-FET 432 for IM3 distortion components, $g_{m4}''$ is the transconductance of P-FET 434 for IM3 distortion components, and $I_3'''$ and $I_4'''$ are IM3 distortion currents from P-FETs 432 and 434, respectively.

As shown in equation (4), the IM3 distortion current from P-FET 432 is equal to the cube of the output signal, $V_{out}$, times the drain-to-source conductance $g_{ds3}''$ of P-FET 432 for IM3 distortion components. The drain-to-source conductance (and not the transconductance) is applicable for P-FET 432 because the drain current is given with respect to the drain voltage (and not the gate voltage). As shown in equation (5), the IM3 distortion current from P-FET 434 is equal to the cube of the output signal, $V_{out}$, times the transconductance $g_{m4}''$ of P-FET 434 for IM3 distortion components.

IM3 distortion cancellation may be achieved for input stage 410, as follows:

$$I_1'''+I_2''' = V_{in}^3 \cdot g_{m1}'' + V_{in}^3 \cdot g_{m2}'' = 0. \qquad \text{Eq (6)}$$

Equation (6) indicates that IM3 distortion in input stage 410 may be completely cancelled if the sum of the IM3 distortion currents from N-FETs 412 and 422 is equal to zero. In general, distortion cancellation may be achieved by having the IM3 distortion current from N-FET 422 be approximately equal in magnitude but opposite in phase with respect to the IM3 distortion current from N-FET 412. The effectiveness of the distortion cancellation (or the degree of cancellation) is dependent on the accuracy in matching $I_2'''$ to $I_1'''$. This matching may be controlled based on any one or any combination of the following:

Select a suitable value for inductor 416,
Adjust the bias of N-FET 412 and/or N-FET 422,
Adjust the size of N-FET 412 and/or N-FET 422,
Apply different input signals to N-FETs 412 and 422, and
Add reactive component(s) at appropriate location(s) in input circuit 410.

Inductor 416 contributes a phase shift in the drain current of N-FET 412. The inductor value may be selected to obtain 180° phase difference between $I_1'''$ and $I_2'''$ at a frequency band/range of interest. Different inductor values may be used for different frequency bands/ranges.

The bias currents and sizes of N-FETs 412 and 422 may affect the amplitude and/or phase shift of the drain currents of these N-FETs. The bias current and/or size of one or both N-FETs may be selected to achieve good IM3 distortion cancellation. For example, the bias voltage, $V_{bias2}$, for N-FET 422 may be varied until good IM3 distortion cancellation is achieved for input stage 410. The size of N-FET 422 may also be varied by implementing multiple N-FETs in parallel and enabling or disabling each of these N-FETs to obtain the desired distortion cancellation.

The same input signal, $V_{in}$, may be provided to the gates of both N-FETs 412 and 422, as shown in FIG. 4. In this case, the 180° phase difference between $I_1'''$ and $I_2'''$ may be obtained by varying the characteristics and/or bias of the circuit components in input stage 410. Different input signals may also be applied to the gates of N-FETs 412 and 422. For example, the input signal, $V_{in}$, may be provided to the gate of N-FET 412, and an inverted or a phase shifted version of the input signal may be provided to the gate of N-FET 422. In this case, input signals for N-FETs 412 and 422 would have some phase shift, and the circuit components in input stage 410 may be designed to provide the remainder of the 180° phase shift.

Other circuit components may also be used to obtain the 180° phase shift. For example, an inductor may be inserted between the source of N-FET 422 and circuit ground. Other reactive components may also be added at other locations within input stage 410.

IM3 distortion cancellation may be achieved for load stage 430, as follows:

$$I_3'''+I_4''' = V_{out}^3 \cdot g_{ds3}'' + V_{out}^3 \cdot g_{m4}'' = 0. \qquad \text{Eq (7)}$$

Equation (7) indicates that IM3 distortion in load stage 430 may be completely cancelled if the sum of the IM3 distortion currents from P-FETs 432 and 434 is equal to zero. In general, distortion cancellation may be achieved by having the IM3 distortion current from P-FET 434 be approximately equal in magnitude but opposite in phase with respect to the IM3 distortion current from P-FET 432. The IM3 distortion cancellation in equation (7) may be performed based on any one or any combination of the following:

Adjust the bias of P-FET 432 and/or P-FET 434,
Adjust the size of P-FET 432 and/or P-FET 434, and
Add reactive component(s) at appropriate location(s) in load circuit 430.

The bias currents and sizes of P-FETs 432 and 434 may affect the amplitude and/or phase shift of the drain currents of these P-FETs. The bias current and/or size of one or both P-FETs may be selected to achieve good IM3 distortion cancellation. For example, the bias voltage, $V_{bias3}$, for P-FET 434 may be varied until good IM3 distortion cancellation is achieved for load stage 430. The size of P-FET 434 may also be varied by implementing multiple P-FETs in parallel and enabling or disabling each of these P-FETs to obtain the desired distortion cancellation. Other circuit components may also be used to obtain the 180° phase shift. For example, an inductor may be inserted at the source of P-FET 432 and/or 434. Other reactive components may also be added at other locations within load stage 430.

The bias and sizes of the N-FETs and P-FETs in LNA 400 may be selected based on empirical measurements, computer simulation, etc., to achieve good distortion cancellation. LNA 400 may then be fabricated with the selected bias and transistor sizes. The same bias and transistor sizes may be used for all fabricated devices (e.g., RFICs) having LNA 400. Alternatively, LNA 400 may be designed with adjustable bias and/or transistor sizes. Distortion cancellation may be tuned (e.g., during factory calibration) for each fabricated device having LNA 400.

Figure 5:
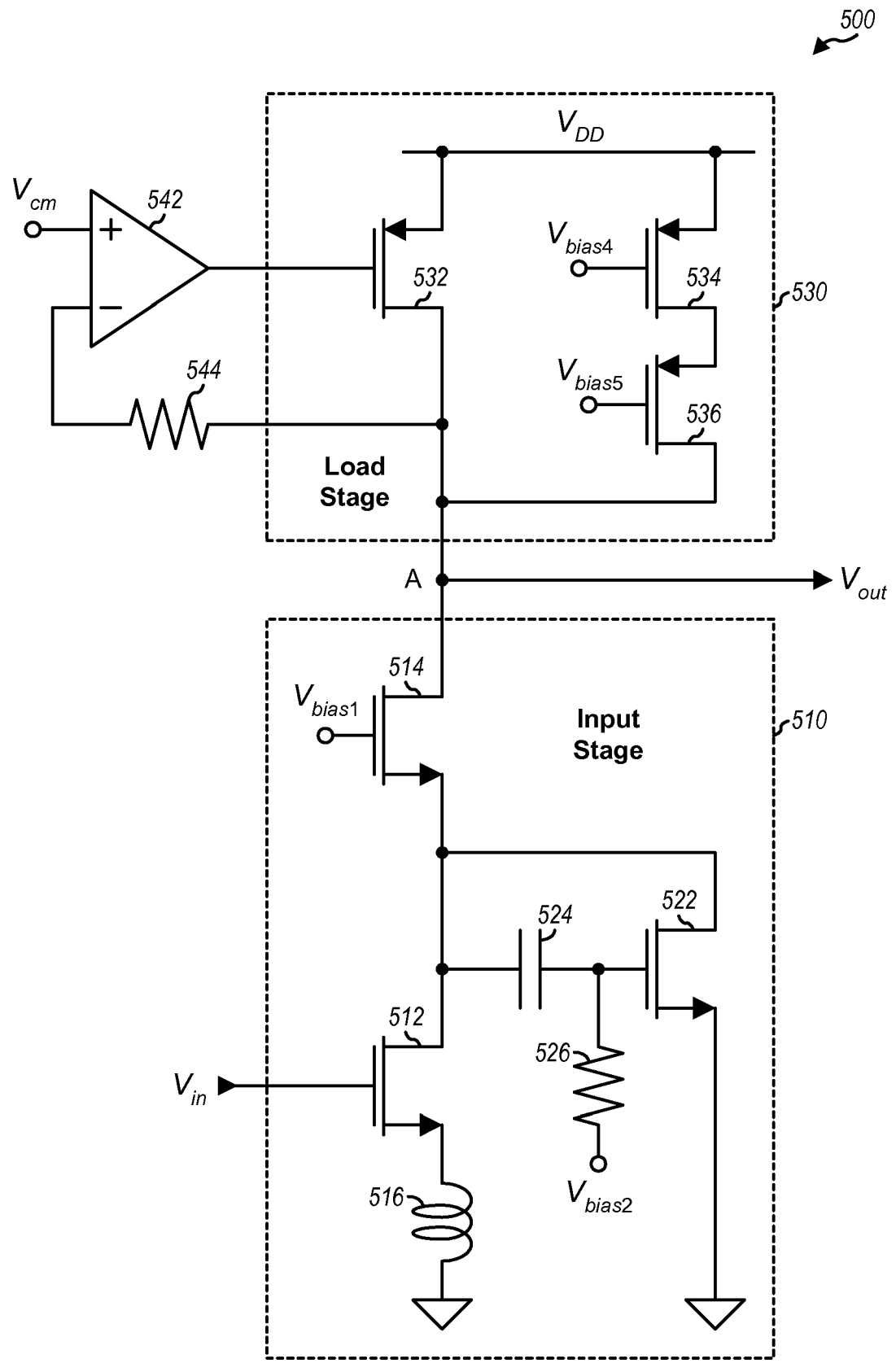
FIG. 5 shows a schematic diagram of another LNA with linearization.

FIG. 5 shows a schematic diagram of a design of an LNA 500 with linearization, which may also be used for LNA 152 in FIG. 1. LNA 500 includes an input stage 510 with linearization via distortion cancellation and a load stage 530 also with linearization via distortion cancellation.

Input stage 510 includes N-FETs 512 and 514 and an inductor 516 that are coupled in similar manner as N-FETs 212 and 214 and inductor 216, respectively, in FIG. 2. Input stage 510 further includes an N-FET 522 having its source coupled to circuit ground, its gate coupled to the drain of N-FET 512 via an AC coupling capacitor 524, and its drain coupled to the drain of N-FET 512. A resistor 526 has one end coupled to the gate of N-FET 522 and the other end receiving bias voltage, Vbias2. N-FET 512 is a main transistor that provides signal amplification and has a transconductance of $g_{m1}$. N-FET 522 is an auxiliary transistor that linearizes the input stage via distortion cancellation and has a transconductance of $g_{m2}$, where $g_{m2}$ may be much less than $g_{m1}$ in order to avoid canceling the desired signal component from N-FET 512.

Load stage 530 includes a P-FET 532 that is coupled as described above for P-FET 312 in FIG. 3. Load stage 530 further includes stacked P-FETs 534 and 536 that are coupled in parallel with P-FET 532. P-FET 534 has its source coupled to the supply voltage, $V_{DD}$, its gate receiving a bias voltage, $V_{bias4}$, and its drain coupled to the source of P-FET 536. P-FET 536 has its gate receiving a bias voltage, $V_{bias5}$, and its drain coupled to the drain of P-FET 532. P-FET 532 provides a main load for input stage 510. P-FETs 534 and 536 provide an auxiliary load and linearize the overall load via distortion cancellation. The use of stacked P-FETs 534 and 536 may provide better load isolation. An op-amp 542 and a resistor 544 are coupled in similar manner as op-amp 342 and resistor 344, respectively, in FIG. 3 and form a feedback loop that sets the bias of P-FET 532.

IM3 distortion cancellation for input stage 510 may be achieved by selecting an appropriate value for inductor 516, adjusting the bias of N-FET 512 and/or 522, varying the size of N-FET 512 and/or 522, etc. IM3 distortion cancellation for load stage 530 may be achieved by adjusting the bias of P-FET 534 and/or 536, varying the sizes of P-FET 534 and/or 536, etc. Other reactive components may also be added in input stage 510 and/or load stage 530 to improve IM3 distortion cancellation. For example, an inductor may be inserted at the source of N-FET 522, P-FET 532, and/or P-FET 534.

Figure 6:
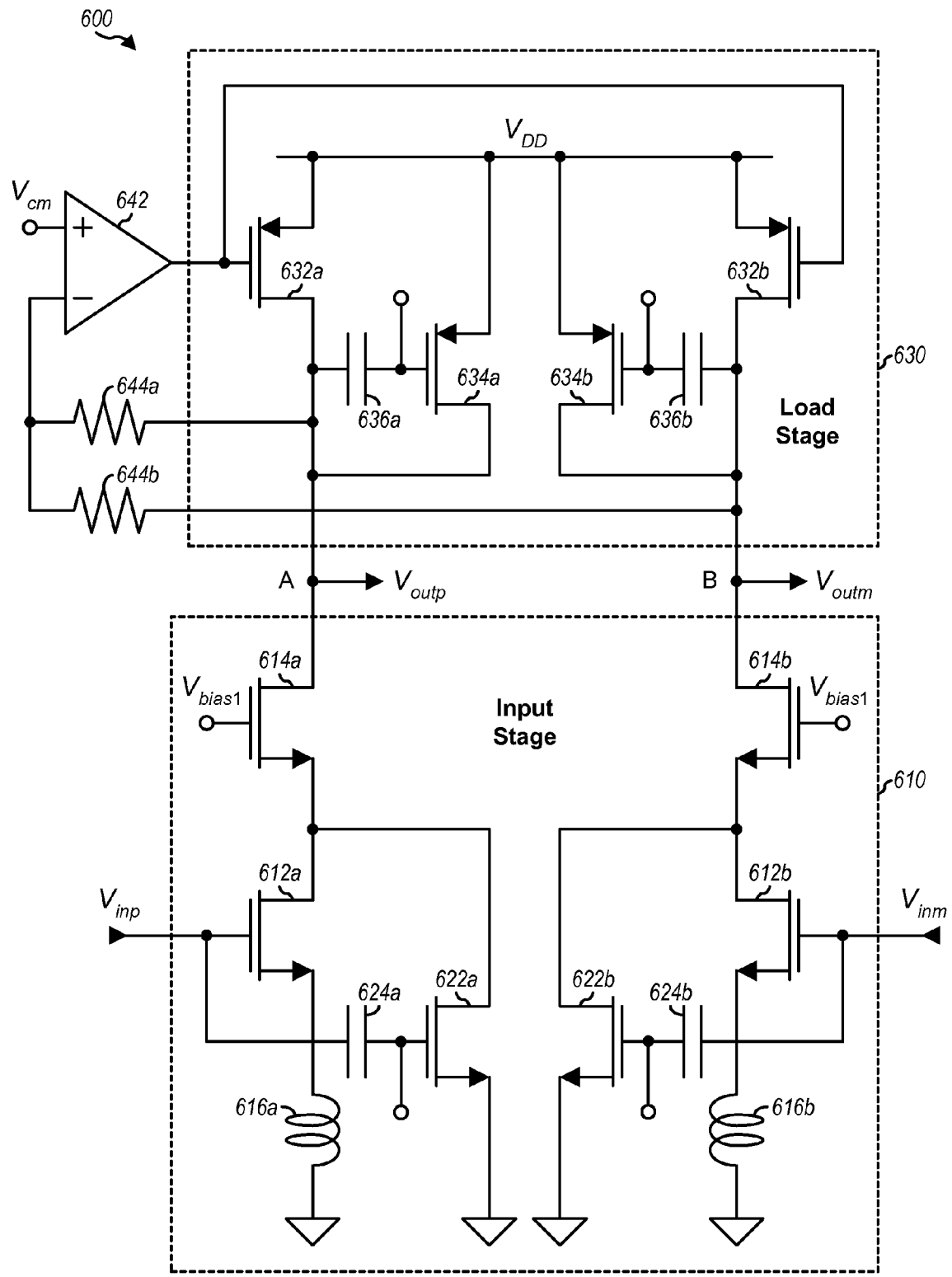
FIG. 6 shows a schematic diagram of a differential LNA with linearization.

FIG. 6 shows a schematic diagram of a design of a differential LNA 600 with linearization, which may also be used for LNA 152 in FIG. 1. LNA 600 includes an input stage 610 with linearization via distortion cancellation and a load stage 630 also with linearization via distortion cancellation.

Input stage 610 includes N-FETs 612a, 614a and 622a, an inductor 616a, and a capacitor 624a that are coupled in similar manner as N-FETs 412, 414 and 422, inductor 416, and capacitor 424, respectively, in FIG. 4. Input stage 610 further includes N-FETs 612b, 614b and 622b, an inductor 616b, and a capacitor 624b that are coupled in similar manner as N-FETs 612a, 614a and 622a, inductor 616a, and capacitor 624a, respectively. The gate of N-FET 612a receives an LNA input signal, $V_{inp}$, and the gate of N-FET 612b receives a complementary LNA input signal, $V_{inm}$. The drain of N-FET 614a provides an LNA output signal, $V_{outp}$, and the drain of N-FET 614b provides a complementary LNA output signal, $V_{outm}$.

Load stage 630 includes P-FETs 632a and 634a and a capacitor 636a that are coupled in similar manner as P-FETs 432 and 434 and capacitor 436, respectively, in FIG. 4. Load stage 630 further includes P-FETs 632b and 634b and a capacitor 636b that are coupled in similar manner as P-FETs 632a and 634a and capacitor 636a, respectively. The drains of P-FETs 632a and 634a couple to the drain of N-FET 614a and provide the LNA output signal, $V_{outp}$. The drains of P-FETs 632b and 634b couple to the drain of N-FET 614b and provide the complementary LNA output signal, $V_{outm}$.

An op-amp 642 and a resistor 644a are coupled in similar manner as op-amp 342 and resistor 344, respectively, in FIG. 3. A resistor 644b has one end coupled to the drains of P-FETs 632b and 634b and the other end coupled to the inverting input of op-amp 642. Op-amp 642 and resistors 644a and 644b form a common mode feedback loop that sets the average of the drain voltages of P-FETs 632a and 632b to the common mode voltage, $V_{cm}$.

The differential design shown in FIG. 6 may provide certain advantages such as larger signal swing, better immunity to common mode noise, improved linearity, etc. IM3 distortion cancellation may be performed for each of the two branches in input stage 610, as described above for FIG. 4. IM3 distortion cancellation may also be performed for each of the two branches in load stage 630, as described above for FIG. 4.

The LNA designs in FIGS. 4, 5 and 6 may also be used for other types of amplifiers such as the VGAs and amplifiers shown in FIG. 1. These designs may also be used for buffers, active filters, etc.

Figure 7:
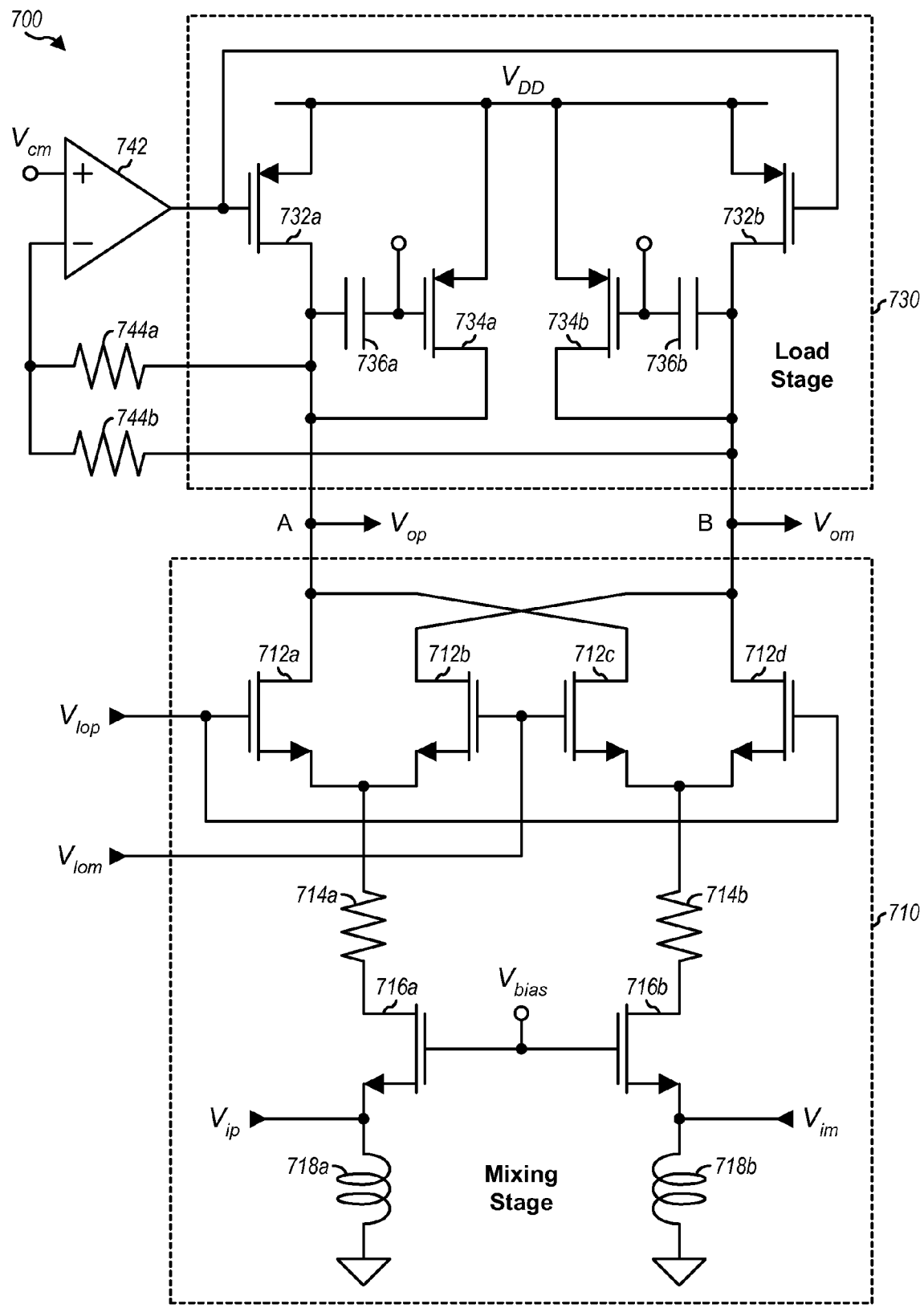
FIG. 7 shows a schematic diagram of a mixer with linearized active load.

FIG. 7 shows a schematic diagram of a design of a mixer 700 with linearized active load. Mixer 700 may be used for mixer 138 and/or mixer 156 in FIG. 1. Mixer 700 includes a mixing stage 710 and a load stage 730 with linearization via distortion cancellation.

Mixing stage 710 includes four N-FETs 712a, 712b, 712c and 712d that are coupled as a Gilbert cell multiplier. N-FETs 712a and 712b have their sources coupled together and their drains coupled to nodes A and B, respectively, which provide the differential mixer output signal, $V_{op}$ and $V_{om}$. N-FETs 712c and 712d have their sources coupled together and their drains coupled to nodes A and B, respectively. The gates of N-FETs 712a and 712d are coupled together and receive an LO signal, $V_{lop}$. The gates of N-FETs 712b and 712c are coupled together and receive a complementary LO signal, $V_{lom}$. An N-FET 716a has its gate receiving a bias voltage, $V_{bias}$, its drain coupled to one end of a resistor 714a, and its source coupled to one end of an inductor 718a. The other end of resistor 714a is coupled to the sources of N-FETs 712a and 712b, and the other end of inductor 718a is coupled to circuit ground. An N-FET 716b, a resistor 714b, and an inductor 718b are coupled in similar manner as N-FET 716a, resistor 714a, and inductor 718a, respectively. The source of N-FET 716a receives a mixer input signal, $V_{ip}$, and the source of N-FET 716b receives a complementary mixer input signal, $V_{im}$.

Load stage 730 includes P-FETs 732a, 734a, 732b and 734b and capacitors 736a and 736b that are coupled in similar manner as P-FETs 632a, 634a, 632b and 634b and capacitors 636a and 636b, respectively, in FIG. 6. P-FETs 732a and 732b provide the main load for mixing stage 710. P-FETs 734a and 734b provide the auxiliary load that cancels distortion in the main load. An op-amp 742 and resistor 744a and 744b are coupled in similar manner as op-amp 642 and resistor 644a and 644b, respectively, in FIG. 6 and form a common mode feedback loop that sets the bias of P-FETs 732a and 732b.

For quadrature downconversion, the Gilbert cell multiplier composed of N-FETs 712a through 712d and resistors 714a and 714b may be replicated. Load stage 730 may also be replicated, and the replicated load stage may be coupled to the replicated Gilbert cell multiplier. N-FETs 716a and 716b may be coupled to both Gilbert cell multipliers. A differential inphase (I) LO signal may be provided to N-FETs 712a through 712d of input stage 710, which may provide a differential I downconverted signal. A differential quadrature (Q) LO signal may be provided to N-FETs 712a through 712d of the replicated Gilbert cell multiplier, which may provide a differential Q downconverted signal.

In the designs described above, an active load for an active circuit may have a main transistor that may generate distortion due to nonlinearity. An auxiliary transistor may generate a distortion replica that may be used to cancel the distortion generated by the main transistor. A composite transistor composed of the main and auxiliary transistors may be linear and may minimally degrade the linearity of the entire active circuit. For example, the transconductance of an LNA may be linearized by distortion cancellation. In general, one or more main transistors may be used to provide the active load, and one or more auxiliary transistors may be used to linearize the main transistor(s). The amount of distortion cancellation may be controlled by adjusting various parameters such as the bias and/or size of the main and/or auxiliary transistors. The use of multiple auxiliary transistors may allow for better cancellation of distortion, more tolerance to IC process variations, etc.

In general, an apparatus may include a first stage and a load stage. The first stage may receive an input signal and provide an output signal. For an amplifier, the first stage may amplify the input signal and provide the output signal having a larger signal level. For a mixer, the first stage may mix the input signal with an LO signal at a first frequency and provide the output signal at a second frequency. The load stage may be coupled to the first stage and provide an active load for the first stage. The load stage may be linearized by canceling distortion (e.g., IM3 distortion) generated by the active load, which may result in the output signal having less distortion.

In one design, the load stage may include a first transistor (e.g., P-FET 432 in FIG. 4 or P-FET 532 in FIG. 5) that may provide the active load for the first stage but may generate distortion due to its nonlinearity. The load stage may further include at least one transistor that may be coupled to the first transistor and used to generate a replica of the distortion from the first transistor. The distortion replica from the at least one transistor may be used to cancel the distortion from the first transistor. The at least one transistor may comprise a second transistor (e.g., P-FET 434 in FIG. 4) that may receive an output of the first transistor and generate the distortion replica based on the first transistor output. Alternatively, the at least one transistor (e.g., P-FETs 534 and 536 in FIG. 5) may be coupled in parallel with the first transistor and may receive at least one bias voltage. The at least one transistor may also be coupled to the first transistor in other manners. The at least one transistor may have bias and/or size selected to match the distortion replica to the distortion from the first transistor. The apparatus may further include an op-amp used to set the bias of the first transistor, e.g., to provide a gate voltage for the first transistor to set a drain voltage of the first transistor at a desired bias voltage.

In one design, the first stage may include a main transistor (e.g., N-FET 412 in FIG. 4 or N-FET 512 in FIG. 5) that may receive and amplify the input signal and generate distortion due to its nonlinearity. The first stage may further include an auxiliary transistor (e.g., N-FET 424 or 524) that may be coupled to the main transistor and used to generate a replica of the distortion from the main transistor. The distortion replica from the auxiliary transistor may be used to cancel the distortion from the main transistor. The auxiliary transistor may receive the input signal (e.g., as shown in FIG. 4) or an output of the main transistor (e.g., as shown in FIG. 5). The first stage may further include a cascode transistor (e.g., N-FET 414 or 514) that may provide load isolation for the main transistor.

The transistors may comprise FETs or some other type of transistors. For a differential design, the first stage may receive a differential input signal and provide a differential output signal, and the load stage may provide a differential active load for the first stage.

The techniques described herein may allow active circuits such as LNAs and mixers to be designed with transistors as active load instead of on-chip and/or off-chip inductors. The techniques may allow high linearity to be achieved without using inductors as load. The techniques may sufficiently reduce distortion generated by the load transistors so that requirements of high performance systems such as CDMA2000 can be met.

The techniques may provide various advantages such as smaller silicon area and lower cost. The techniques may be especially beneficial for a wireless device that supports multiple frequency bands, multiple operating modes or systems, etc. The techniques may facilitate removal of an inter-stage SAW filter between the LNA and the mixer, so that the LNA output can be coupled directly to the mixer. The elimination of on-chip and off-chip inductors may reduce cost, reduce LO re-radiation, and provide other benefits. The inductors used for source degeneration and/or other purposes, e.g., as shown in FIGS. 2 through 7, may be low Q and may be implemented with compact designs.

The active circuits with load linearization described herein may be used for various types of active circuit such as amplifiers, mixers, active filters, etc. The active circuits may be used for various applications such as communication, networking, computing, consumer electronics, etc. The active circuits may be used for cellular phones, PDAs, wireless devices, handheld devices, wireless modems, laptop computers, cordless phones, etc. The active circuits may also be used for various communication systems such as CDMA2000 systems, Wideband-CDMA (W-CDMA) systems, Global System for Mobile Communications (GSM) systems, wireless local area networks (WLANs), etc. The active circuits may also be used for broadcast receivers, Bluetooth devices, Global Positioning System (GPS) receivers, etc.

The active circuits described herein may be used for various frequency ranges including RF, IF, and baseband. For example, the active circuits may be used for frequency bands commonly employed for wireless communication, such as:
  Cellular band from 824 to 894 MHz,
  Personal Communication System (PCS) band from 1850 to 1990 MHz,
  Digital Cellular System (DCS) band from 1710 to 1880 MHz,
  GSM900 band from 890 to 960 MHz,
  International Mobile Telecommunications-2000 (IMT-2000) band from 1920 to 2170 MHz, and
  GPS band from 1574.4 to 1576.4 MHz.

The active circuits described herein may be implemented within an IC, an RFIC, a mixed-signal IC, an ASIC, a printed circuit board (PCB), an electronics device, etc. These active circuits may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), etc.

An apparatus implementing the active circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus comprising:
a first stage configured to receive an input signal and provide an output signal; and
a load stage coupled to the first stage and configured to provide an active load for the first stage, the load stage and the first stage being independently linearized by canceling distortion generated by the active load.

2. The apparatus of claim 1, wherein the load stage comprises
a first transistor configured to provide the active load for the first stage, the first transistor generating distortion due to nonlinearity, and
at least one transistor coupled to the first transistor and configured to generate a replica of the distortion from the first transistor, the distortion replica being used to cancel the distortion from the first transistor.

3. The apparatus of claim 2, wherein the at least one transistor comprises a second transistor configured to receive an output of the first transistor and generate the distortion replica based on the output of the first transistor.

4. The apparatus of claim 2, wherein the at least one transistor is coupled in parallel with the first transistor and configured to receive at least one bias voltage.

5. The apparatus of claim 2, wherein the at least one transistor has bias selected to match the distortion replica to the distortion from the first transistor.

6. The apparatus of claim 2, wherein the at least one transistor has size selected to match the distortion replica to the distortion from the first transistor.

7. The apparatus of claim 2, wherein the first transistor and the at least one transistor comprise field effect transistors (FETs).

8. The apparatus of claim 1, wherein the load stage is linearized by canceling third-order intermodulation (IM3) distortion generated by the active load.

9. The apparatus of claim 1, wherein the load stage comprises a transistor configured to provide the active load for the first stage, and wherein the apparatus further comprises:
an operational amplifier coupled to the transistor and configured to set bias of the transistor.

10. The apparatus of claim 9, wherein the operational amplifier is configured to provide a gate voltage for the transistor to set a drain voltage of the transistor at a bias voltage.

11. The apparatus of claim 1, wherein the first stage is configured to amplify the input signal and provide the output signal having a larger signal level.

12. The apparatus of claim 1, wherein the first stage comprises
a first transistor configured to receive and amplify the input signal, the first transistor generating distortion due to nonlinearity, and
a second transistor coupled to the first transistor and configured to generate a replica of the distortion from the first transistor, the distortion replica being used to cancel the distortion from the first transistor.

13. The apparatus of claim 12, wherein the second transistor is configured to receive the input signal and generate the distortion replica based on the input signal.

14. The apparatus of claim 12, wherein the second transistor is configured to receive an output of the first transistor and generate the distortion replica based on the output of the first transistor.

15. The apparatus of claim 12, wherein the first stage further comprises
a third transistor coupled to the first transistor and configured to receive an output of the first transistor and provide the output signal, the third transistor providing load isolation for the first transistor.

16. The apparatus of claim 1, wherein the first stage is configured to receive a differential input signal and provide a differential output signal, and wherein the load stage is configured to provide a differential active load for the first stage.

17. An integrated circuit comprising:
a first stage configured to receive an input signal and provide an output signal; and
a load stage coupled to the first stage and configured to provide an active load for the first stage, the load stage and the first stage being independently linearized by canceling distortion generated by the active load.

18. The integrated circuit of claim 17, wherein the load stage comprises
a first transistor configured to provide the active load for the first stage, the first transistor generating distortion due to nonlinearity, and
at least one transistor coupled to the first transistor and configured to generate a replica of the distortion from the first transistor, the distortion replica being used to cancel the distortion from the first transistor.

19. The integrated circuit of claim 17, wherein the first stage is configured to amplify the input signal and provide the output signal having a larger signal level.

20. The integrated circuit of claim 17, wherein the first stage is configured to mix the input signal with a local oscillator (LO) signal at a first frequency and provide the output signal at a second frequency.

21. An apparatus comprising:
means for processing an input signal with an active load to obtain an output signal; and
means for canceling distortion generated by the active load at a first stage and a load stage to reduce distortion in the output signal, wherein the first stage and the load stage are independently linearized.

22. The apparatus of claim 21, wherein the means for canceling the distortion generated by the active load comprises
means for generating a replica of the distortion generated by the active load, and
means for canceling the distortion generated by the active load with the distortion replica.

23. The apparatus of claim 21, wherein the means for processing the input signal comprises means for amplifying the input signal to obtain the output signal having a larger signal level.

24. A method comprising:
processing an input signal with an active load to obtain an output signal; and
canceling distortion generated by the active load at a first stage and a load stage to reduce distortion in the output signal, wherein the first stage and the load stage are independently linearized.

25. The method of claim 24, wherein the canceling the distortion generated by the active load comprises
generating a replica of the distortion generated by the active load, and
canceling the distortion generated by the active load with the distortion replica.

26. The method of claim 24, wherein the processing the input signal comprises amplifying the input signal to obtain the output signal having a larger signal level.

27. A wireless communication device comprising:
- an antenna operative to provide an input signal; and
- a low noise amplifier (LNA) operatively coupled to the antenna and comprising a first stage and a load stage, the first stage configured to receive the input signal and provide an output signal, the load stage being coupled to the first stage, configured to provide an active load for the first stage, and the load stage and the first stage being independently linearized by canceling distortion generated by the active load.

* * * * *